United States Patent [19]
Pendse et al.

[11] Patent Number: 5,818,114
[45] Date of Patent: Oct. 6, 1998

[54] RADIALLY STAGGERED BOND PAD ARRANGEMENTS FOR INTEGRATED CIRCUIT PAD CIRCUITRY

[75] Inventors: Rajendra D. Pendse, Fremont; Rita Horner, Santa Clara, both of Calif.

[73] Assignee: Hewlett-Packard Company, Palo Alto, Calif.

[21] Appl. No.: 452,224

[22] Filed: May 26, 1995

[51] Int. Cl.$^6$ ............... H01L 23/48; H01L 23/52; H01L 29/40

[52] U.S. Cl. ............... 257/786; 257/203; 257/208; 257/779

[58] Field of Search ................... 257/203, 208, 257/779, 786

[56] References Cited

U.S. PATENT DOCUMENTS

| | | | |
|---|---|---|---|
| 5,173,763 | 12/1992 | Cipolla et al. | 257/668 |
| 5,235,209 | 8/1993 | Shimizu et al. | 257/692 |
| 5,245,214 | 9/1993 | Simpson | 257/666 |
| 5,252,854 | 10/1993 | Arita et al. | 257/676 |
| 5,329,143 | 7/1994 | Chan et al. | 257/173 |
| 5,359,227 | 10/1994 | Liang et al. | 257/784 |
| 5,491,364 | 2/1996 | Brandenburg et al. | 257/786 |

FOREIGN PATENT DOCUMENTS

| | | | |
|---|---|---|---|
| 2 664 097 | 1/1992 | France | H01L 23/50 |
| 55-11366 | 1/1980 | Japan | H01L 21/92 |
| 55-24479 | 2/1980 | Japan | H01L 23/48 |
| 55-143045 | 11/1980 | Japan | H01L 21/60 |
| 57-15455 | 1/1982 | Japan | H01L 27/06 |
| 58-86738 | 5/1983 | Japan | H01L 21/66 |
| 60-35524 | 2/1985 | Japan | H01L 21/60 |
| 2-303037 | 5/1989 | Japan | H01L 21/60 |
| 1-298731 | 12/1989 | Japan | H01L 21/60 |
| 2-78252 | 3/1990 | Japan | H01L 23/12 |
| 2-228058 | 9/1990 | Japan | H01L 23/50 |
| 2-277250 | 11/1990 | Japan | H01L 21/60 |
| 2-278742 | 11/1990 | Japan | H01L 21/60 |
| 3-34337 | 2/1991 | Japan | H01L 21/60 |
| 3-152956 | 6/1991 | Japan | H01L 21/82 |
| 3-185730 | 8/1991 | Japan | H01L 21/321 |
| 3-190270 | 8/1991 | Japan | H01L 23/50 |
| 3-220755 | 9/1991 | Japan | H01L 23/12 |
| 3-250656 | 11/1991 | Japan | H01L 23/50 |
| 3-261152 | 11/1991 | Japan | H01L 21/60 |
| 4-7865 | 1/1992 | Japan | H01L 23/50 |
| 4-99056 | 3/1992 | Japan | H01L 25/065 |
| 4-127449 | 4/1992 | Japan | H01L 21/66 |
| 4-155954 | 5/1992 | Japan | H01L 25/65 |
| 4-167450 | 6/1992 | Japan | H01L 23/12 |
| 4-221837 | 8/1992 | Japan | H01L 21/60 |
| 4-243156 | 8/1992 | Japan | H01L 23/50 |
| 4-261053 | 9/1992 | Japan | H01L 23/50 |
| 5-198613 | 8/1993 | Japan | H01L 21/60 |
| 5-235090 | 9/1993 | Japan | H01L 21/60 |
| 6-84992 | 3/1994 | Japan | H01L 21/60 |
| 2 233 823 | 1/1991 | United Kingdom | H01L 23/50 |

*Primary Examiner*—Wael Fahmy
*Assistant Examiner*—Howard Weiss
*Attorney, Agent, or Firm*—Denise A. Lee

[57] ABSTRACT

The present invention provides a novel I/O pad structure and layout methodology which allows the effective wire bonding pitch to be reduced by circumventing the usual constraints of wire bonding technology. The bonding pad layout of the present invention entails the use of two rows of pads on the chip periphery as opposed to the more conventional single row, in-line arrangement. The bonding pads are arranged in a novel way, by radial staggering, to ensure no overlapping of bonding wire trajectories, even when conventional lead frames are used for the package. Comparing the radially staggered arrangement of the bonding pads of the present invention to convention single row, in-line bonding pad configuration, in the radially staggered arrangement every other pad is moved inward in the radial direction to form a second row. The radial direction used is from a projection point, typically the die center, and is dependent on the I/O circuitry height and the total number of pins of the package. The radially staggered bonding pad configuration allows uniform placement of wire trajectories despite the geometric fan-out from the die bonding pads to the lead frame bonding fingers.

4 Claims, 8 Drawing Sheets

RADIALLY STAGGERED BOND PAD ARRANGEMENTS FOR INTEGRATED CIRCUIT PAD CIRCUITRY

BACKGROUND OF THE INVENTION

The present invention relates generally to packages for integrated circuit devices and more particularly to bond pad arrangements of integrated circuit device packages.

The "ball-wedge" method is the prevalent wirebonding technique for plastic packages which house integrated circuit die. In the ball-wedge method, a ball bond is formed at the die bond pad and a "wedge" bond is formed at the bond finger of the lead frame. Physical limitations in ball-wedge wire bonding have made it difficult to reduce the I/O pad pitch of the IC die below 100 microns. In many high density I/O IC designs, this leads to die sizes that are considerably larger than the active core size. Integrated circuit die where the die size is larger than the active core size are referred to as "pad-limited." Because pad-limited die leave significant portions of the die unused, the die is larger and fewer die will be printed per wafer and die cost is increased.

Three obstacles in reducing the pitch limit for ball-wedge plastic packages are: capillary interference, wire sweep, and corner crowding. Ball-wedge bonds are made using a ceramic "capillary" which supports the bonding wire. Since the capillary wall thickness and diameter of the opening in the capillary occupy a finite space, as the distance between pads decreases, the tip of the capillary interferes with and damages the previously made ball bond. One approach to reducing interference of the capillary with the previously made bond is to reduce the capillary wall diameter and angle in conjunction with reducing the wire diameter. However, this raises other problems: the capillary becomes more brittle; and the average life of the capillary is reduced requiring more frequent capillary replacement and increasing machine down time. In addition, the reduced capillary wall thickness leads to a smaller bond area for the second bond (i.e. the bond made on the lead frame as opposed to the first bond which is the ball bond made on the die). A smaller bond area reduces the strength of the second bond. Further, although reducing the wire diameter does reduce the pitch, it increases susceptibility to wire sweep.

A second obstacle in reducing the pitch limit for ball-wedge packages is wire sweep. The length of the bond wire is a function of the bond finger pitch on the lead frame, the bond pad pitch on the die, and the pin count. Unfortunately, reducing the bond pad pitch on the die increases the bond wire length. Long wires create a problem because of a phenomena in molded plastic packages referred to as "wire sweep" which occurs during the transfer molding process. In the transfer molding process, liquid resin is forced into mold cavities at velocities of 8–12 cm/sec at typical temperatures of 160–180 degrees Celsius. The resulting pressure front tends to move or "sweep" the wires, potentially shorting adjacent wires in the corner areas where they are most tightly spaced.

A third obstacle in reducing the pitch for a ball-wedge package is corner crowding. Due to the geometric effect of radial fan-out, the wire-to-wire spacing is the smallest for the corner wires since the corner wires have larger projection angles. This effect is termed "corner crowding." The problems associated with "corner crowding" are compounded by the fact that the corner wires are already the most susceptible to wire sweep for two reasons. First, for most lead frame designs, the corner wires are also the longest wires. Second, in conventional molds the gates (for input of the plastic resin) are located at the corner of the mold cavity, so the resin flow direction is perpendicular to the diagonal and thus normal to the corner wires.

The effect of corner crowding can be alleviated by increasing the bond pad spacing for a few corner pads. Because most routing programs cannot accommodate this, changing the corner pad spacing must be done manually and intuitively and therefore is not popular with chip design engineers. Furthermore, by putting extra space between several of the pads near the corner, the full benefit of pitch reduction is not realized and the actual die size may not be reduced significantly.

Figure 1:
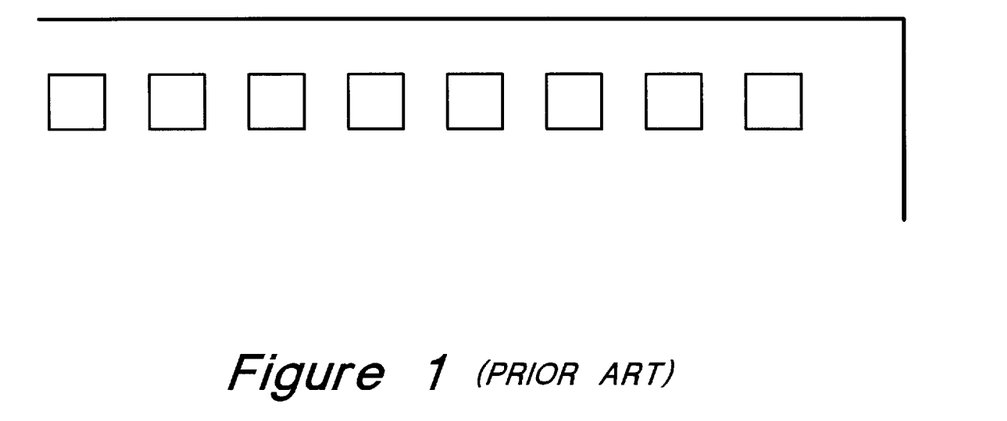
FIG. 1 shows a top view of a portion of a conventional single row in-line bonding pad arrangement.
Figure 2:
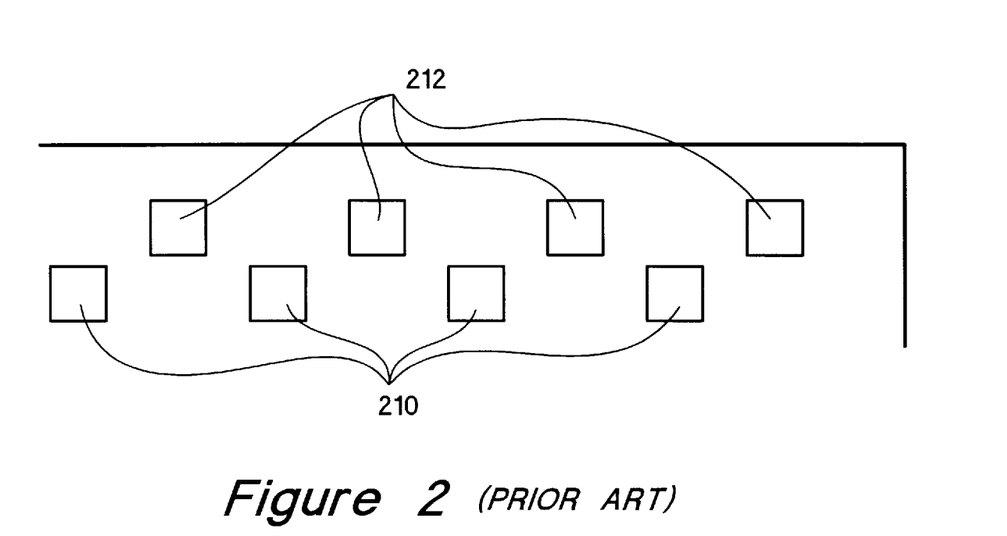
FIG. 2 shows a top view of a portion of an orthogonally staggered bonding pad arrangement.

Other approaches in reducing the pitch are directed towards the bonding pad configuration of the die. A portion of the conventional single row, in-line bonding pad configuration used for plastic packages is shown in FIG. 1. In FIG. 2, the bonding pads are staggered orthogonally. Compared to the conventional single row in-line bonding pad configuration of FIG. 1, the two row orthogonally staggered configuration of FIG. 2 provides additional room for the capillary to land without interference during bonding to the bond pads. The orthogonally staggered configuration of FIG. 2 can typically be implemented only in two tiered package structures where the inner row of bonding pads 210 are bonded to a different surface of the package than the outer row of bonding pads 212, where there is a height differential between the two surfaces. However, such a bond pad configuration is not typically implemented in conventional plastic packages because of fanout.

An approach for decreasing bonding pad pitch without increasing capillary interference, long wires or corner crowding which is reliable and cost effective is needed.

SUMMARY OF THE INVENTION

The present disclosure provides a novel I/O pad structure and layout methodology which allows the effective wire bonding pitch to be reduced by circumventing the usual constraints of wire bonding technology. The bonding pad layout of the present invention entails the use of two rows of pads on the chip periphery as opposed to the more conventional single row, in-line arrangement. The bonding pads are arranged in a novel way, by radial staggering, to ensure no overlapping of bonding wire trajectories, even when conventional lead frames are used for the package.

Comparing the radially staggered arrangement of the bonding pads of the present invention to convention single row, in-line bonding pad configuration, in the radially staggered arrangement every other pad is moved inward in the radial direction to form a second row. The radial direction used is from a projection point, typically the die center, and is dependent on the I/O circuitry height and the total number of pins of the package. The radially staggered bonding pad configuration allows uniform placement of wire trajectories despite the geometric fan-out from the die bonding pads to the lead frame bonding fingers.

A plurality of methods are available for the determination of the proper bonding pad placement according to a radially staggered bonding pad configuration. In a first embodiment, the bonding pads are arranged according to an "equal angle" layout. In the "equal angle" layout scheme, the bond fingers are arranged in a manner so as to subtend equal angles at the projection point. This is in contrast to conventional pad layouts where the subtended angle (between adjacent leads) is higher for the center leads and lower for the corner leads. Other layout schemes for determining the proper position of the radially staggered bonding pads are: the constant intercept method and the geometric progression method.

The present implementation is advantageous because it circumvents common obstacles to fine pitch bonding such as capillary interference, corner crowding and wire sweep. The problem of capillary interference is circumvented by the new bonding pad arrangement since staggering increases the distance between bonding pads assuring that each wire trajectory gets placed well between the trajectories of adjacent wires. In addition, corner crowding and wire sweep is diminished by displacing the wires in the z-direction. This is accomplished by using two different loop heights for the bonds in the inner and outer rows of the pads.

A further understanding of the nature and advantages of the present invention may be realized with reference to the remaining portions of the specification and the attached drawings.

DETAILED DESCRIPTION OF THE PREFERRED EMBODIMENTS

Figure 3:
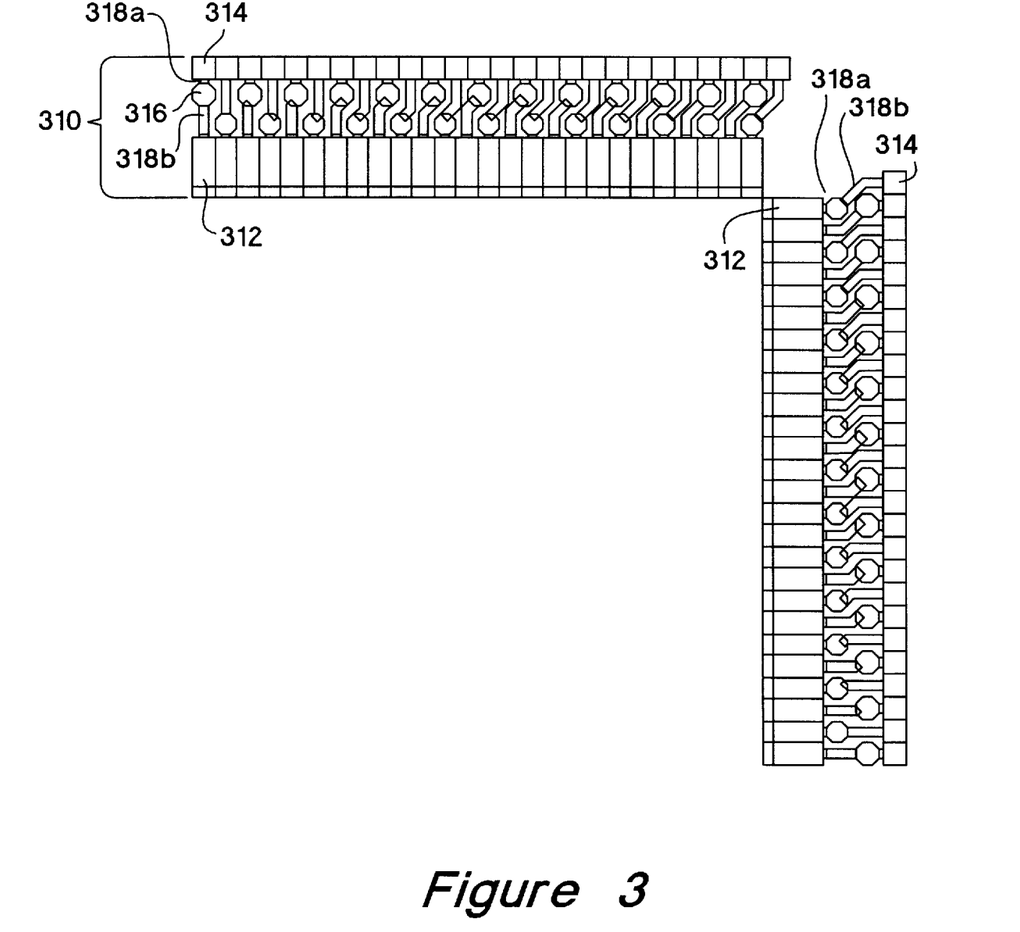
FIG. 3 is a top view of the bonding pad configuration defined by the constant intercept algorithm of the present invention.

FIG. 3 shows a top view of the bonding pad configuration for a 208 pin pad ring according to the present invention. A typical I/O pad of an integrated circuit device consists of three distinct functional modules incorporated into a single integral unit: the I/O circuitry, the ESD structure, and the bonding pad. Referring to FIG. 3 shows an I/O pad 310 including: I/O circuitry 312, an ESD structure 314 and a bonding pad 316. The pad ring configuration of FIG. 3 illustrates a new pad layout where the bonding pads 316 are radially staggered. The bonding pads 316 are connected to its corresponding I/O circuitry 312 and ESD structure 314 by conductive traces 318a and 318b.

Figure 4:
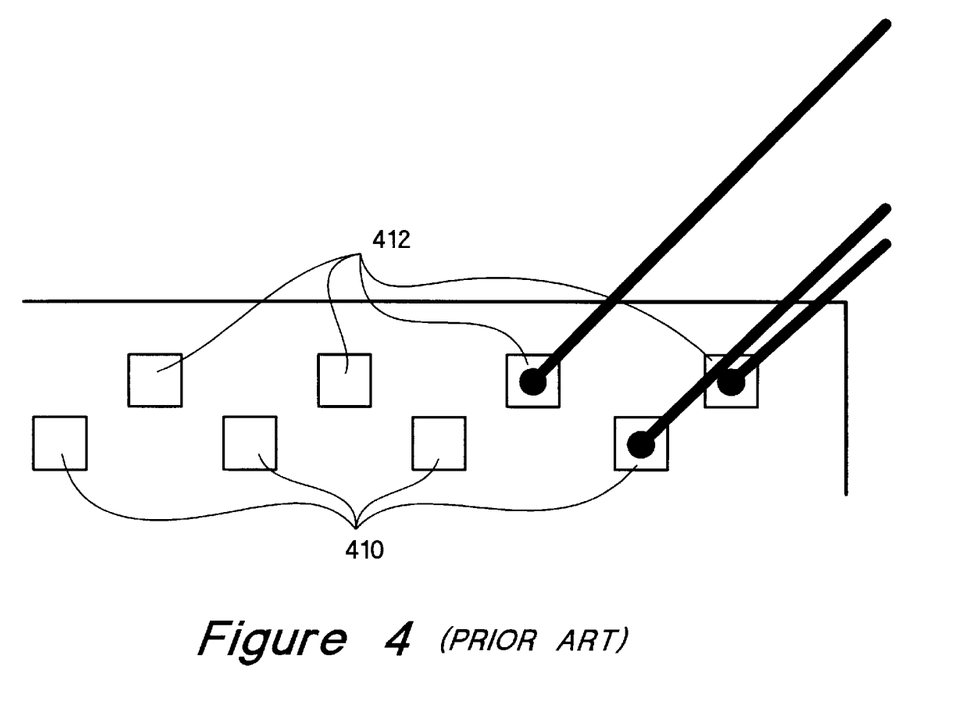
FIG. 4 shows a top view of a representation of orthogonal staggering used in conjunction with conventional lead frames.

FIG. 4 shows a top view of a representation of orthogonal staggering used in conjunction with conventional lead frames after bonding wire attachment. The inner bonding pad row 410 and outer bonding pad row 412 shown in FIG. 4 are wired on the same plane. Unfortunately, as can be seen in FIG. 4, the orthogonally staggered pad configuration can cause wire overlap when there is a fanout. Fanout occurs when the pitch of bond fingers in the package is greater than the bond pad pitch on the die and can only be avoided only when the pitch of the bond fingers in the package is equal to the pitch of the bond pads on the die. While this scenario can be realized in tiered packages such as PGA's, fan-out is unavoidable in lead frame based conventional plastic packages since the bond finger pitch of lead frames (about 8–10 mils) is much greater than the typical bonding pad pitch on the die (4–6 mils).

Figure 5A:
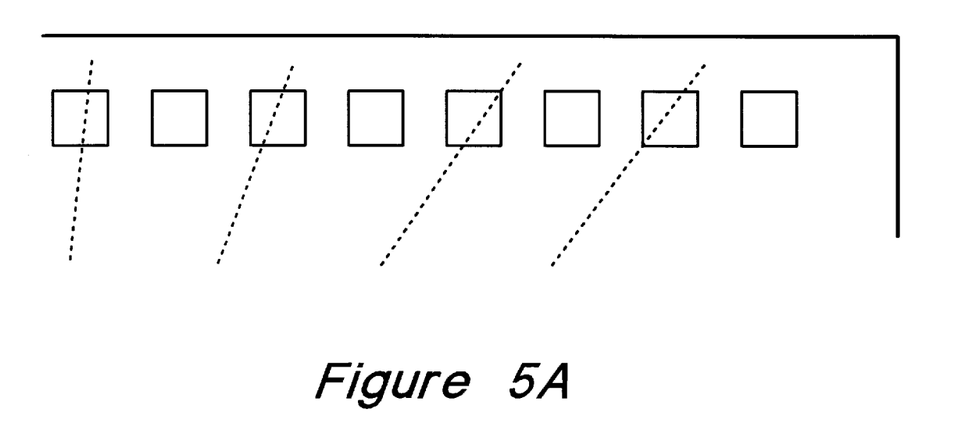
FIG. 5A is a top view of the bonding pad arrangement before the radial staggering step.
Figure 5B:
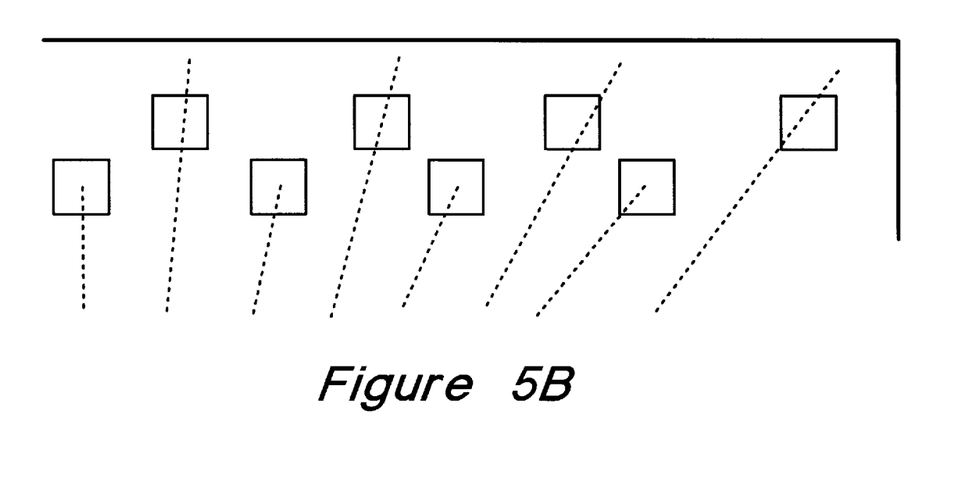
FIG. 5B is a top view of the bonding pad arrangement after the radial staggering step.

Radial staggering helps overcome the problems of wire overlap associated with the orthogonal bonding pad configuration shown in FIG. 4 at fanout. FIGS. 5A and 5B illustrate the radial staggering steps. FIG. 5A is a top view of the bonding pad arrangement before the radial staggering step. FIG. 5B is a top view of the bonding pad arrangement after the radial staggering step. In a radially staggered bond pad arrangement, every other pad is moved in the radial direction to form a second row. The second row of bonding pads may be moved towards or away from the projection point. The term "radial staggering" for a two row bonding pad configuration, means moving every other bonding pad towards or away from the projection point along a projection line. FIG. 5A shows the bonding pad arrangement before movement of alternating pads along the radial direction. FIG. 5B shows the bonding pad arrangement after movement of alternating bonding pads in the radial direction. The radius used is from the center of the die and is dependent on the I/O circuitry height and the total number of pins.

In the embodiment shown in FIG. 3, the package is a 208 plastic quad flat package (PQFP) having an 84.8 microns effective pitch. In the embodiment shown in FIG. 3, the pads are placed in a single row using an 88.9 micron pitch and then every other pad is moved inward in the radial direction, the direction along the projection line, with respect to the center of the die to form the inner row of the pads. In the case of a 208 pin die having an I/O height of 358.9 microns, the inner row bond pad pitch is 168.9 microns. The 208 pin package is given for purposes of example only and obviously the number of pins in the package, pad pitch, etc. will vary.

Figure 6:
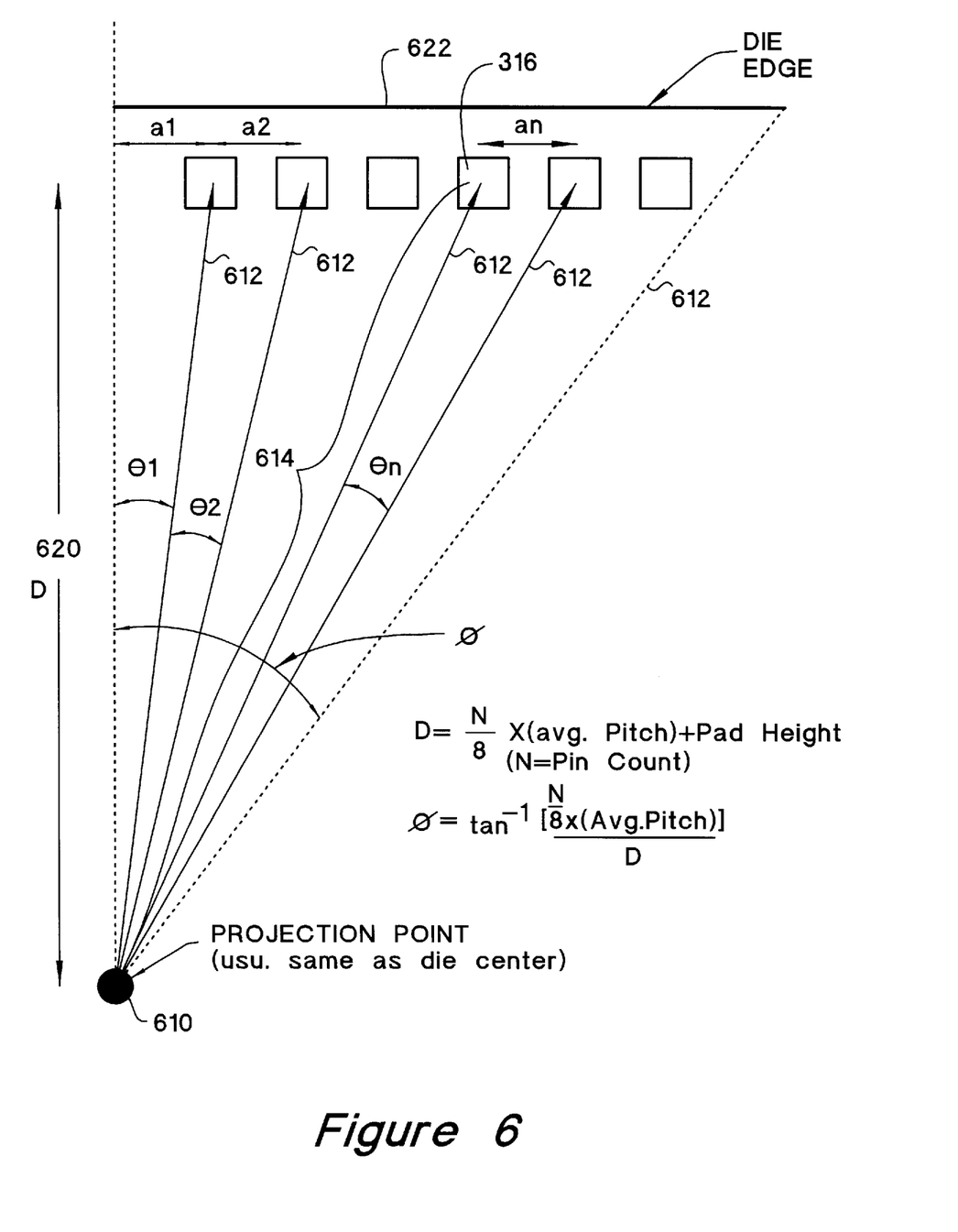
FIG. 6 shows a generic bond pad arrangement and its associated nomenclature.

FIG. 6 shows a top view of one eight portion of the die. In FIG. 6, a projection point 610 defines the point of convergence of the radially staggered projection lines 612 extending from the center of the bonding pads 316 to the projection point 610. The distance 614 ($D_{rn}$) from the projection point to the center of the bonding pad is defined from a reference line $D_o$ (620) which is orthogonal to the die edge 622. The distance between adjacent bonding pads is defined by the distance $a_i$ where i=1,2, . . . , n.

$$D = \frac{N}{8} \times (\text{Avg.Pitch}) + \text{Pad Height}$$

Referring to FIG. 3, it can be seen that every other bonding pad 316 on the integrated circuit die is radially staggered. Several methods may be used for defining the position of the bonding pads before radially staggering the bonding pads. For example, three methods of defining bonding pad position are: the constant intercept method, the constant angle method, and the geometric progression method. Other methods for determining bonding pad position may be used, the important thing is to radially stagger a row of the bonding pads.

One layout method for determining the position of the bonding pads 316 is the constant intercept method. The constant intercept radially staggered layout shown in FIG. 3 is the preferred embodiment because it matches the bond fingers position of standard lead frames. Standard lead frames today, use the constant intercept method to define the position of their bond fingers. The distance between adjacent bonding pads is defined by the distance $a_i$. For the constant intercept method, $a_1=a_2=\ldots=a_n$. Although the distance ($a_i$) is constant, for the constant intercept method, the angle θ (n) between adjacent radially staggered lines is different. Typically, $\theta_1>\theta_2>\ldots\theta_n$. The angle φ is defined as the total subtended angle, is the angle between the reference line (pole) $D_o$ and the die corner. The total subtended angle is proportional to the inverse tangent and defined by the formula $$\phi = \tan^{-1}\frac{\left[\frac{N}{8}\times(\text{Avg.Pitch})\right]}{D}$$

Another method for determining the bonding pad position is the constant angle method. In the constant angle method, the angle between the adjacent bonding pads is equal so that $$\theta_1=\theta_2=\ldots\theta_n$$

where, the distance between adjacent bonding pads varies, typically such that $a_n>a_{n-1}>\ldots>a_2>a_1$.

Another method for determining the position of the bonding pads 316 is the geometric progression method. In a geometric progression layout scheme the distances between adjacent staggered pads are related by a scaling factor. For example, $a_2=r\, a_1$ where r is a scaling factor. Further distances separating adjacent pads are determined by the formula $a_n=r^{n-1}\, a_1$, where n is an integer greater than 1.

Figure 7A:
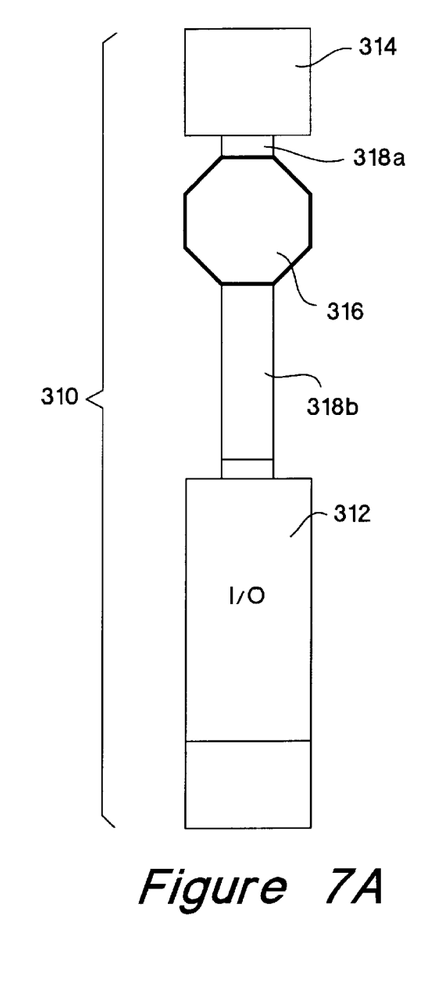
FIG. 7A shows an enlargement of a I/O pad configuration having an octagonal bonding pad.
Figure 7B:
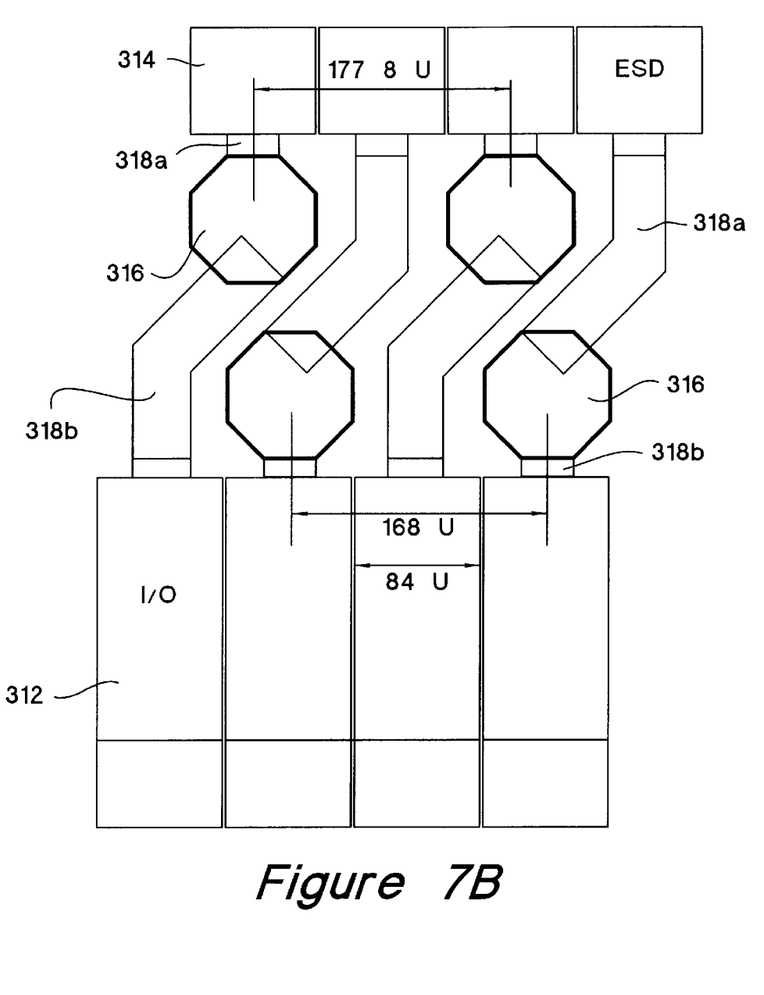
FIG. 7B shows an enlargement of an I/O pad according to the present invention.
Figure 8:
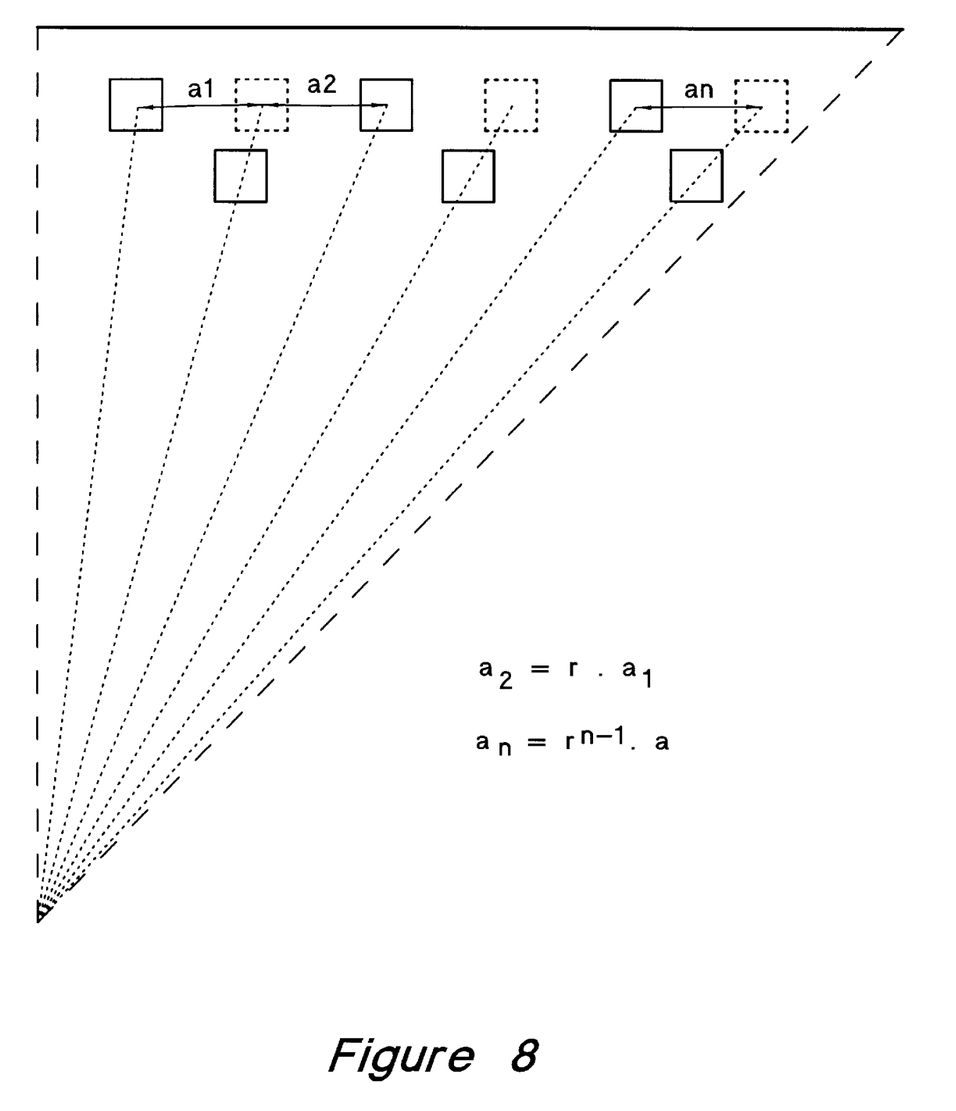
FIG. 8 shows a top view of the bonding pad configuration defined by the geometric progression placement algorithm according to the present invention.
Figure 9:
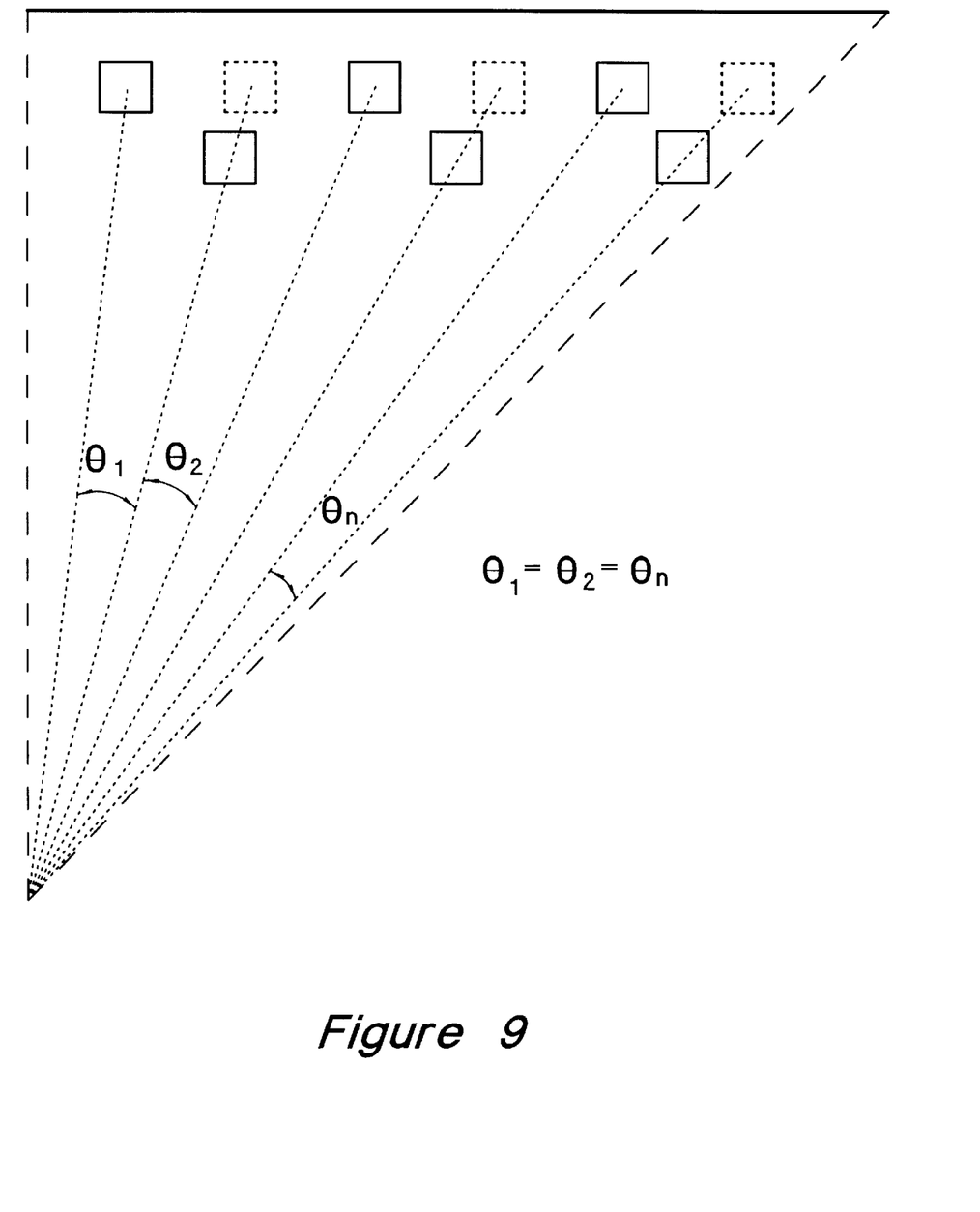
FIG. 9 shows a top view of the bonding pad configuration defined by the constant angle algorithm according to the present invention.

Although the embodiments shown in FIGS. 5 and 6 show square or rectangular bonding pad openings with small amounts of chamfering, this would limit the maximum bus width for connection to bond pads. Therefore, octagonal bond pad openings are preferred and are shown in FIGS. 3, 7A and 7B. In the described 208 PQFP, an internal radius of the bond pad used is 90 microns. The octagonally shaped bonding pads allow wider busses for the bonding pad connections to the ESD and I/O circuitry. The maximum metal bus width used for the bond pad to I/O or to ESD circuitry connection for 208 pin die is dependent on the process design rules for passivation spacing to an unrelated metal, minimum metal to metal spacing, and total number of pads. For the embodiment shown in FIGS. 3 and 6, the minimum metal bus width is 44 microns.

Referring to FIG. 3, it can be seen that the spacing between the adjacent interconnect busses gets smaller for the corner pad openings. As the number of pins increases, the inner row pad pitch increases, while the interconnect metal spacing of the most corner pads decreases at a faster rate. As a result, 44 micron metal width would be too wide in a 240 pin die. In a 100 or a 196 pin die, the inner row pad pitches are smaller than in a 208 pin die, but due to the absence of corner bond pads three to six micron, wider metal buses can be used for metal bonding pad connection to ESD or I/0 circuitry. For the example of FIG. 3, the longest bus connection to the outer row bond pads from the I/O circuitry is about 197 microns and the shortest connection is 155 microns. In order to reduce the interconnect bus resistance to less than 0.1 ohm, preferably all metal layers are used in parallel for the bond pad connection to the I/O or the ESD circuitry.

In the layout process of the integrated circuit device (IC), this single integral unit 310 (often termed the I/O pad cell) is "called" from a library and placed along the perimeter of the functional IC core. This limits the possible spatial arrangements of the bonding pads to the orthogonal arrangement resulting from the automated orthogonal placement of the I/O pad cells. In the present invention, the above paradigm is changed by separating the bonding pad from the I/O pad so as to allow independent placement of the bonding pads in arrangements which can potentially simplify wire bonding. The bonding pads are connected to their respective I/O and ESD circuitry by metal lines incorporated in the device. Furthermore, a bonding pad arrangement is developed which has two important features: first, there are two staggered rows of bonding pads, which helps relax the direct spacing between adjacent bonding pads thereby circumventing the physical limitations of wire bonding technology; second, the relative positioning of adjacent bonds in the two rows is designed in such a manner that meshes with the radial pattern of bonding fingers of conventional lead frames thereby ensuring the uniform placement of adjacent wire trajectories without overlap.

Using a radially staggered bond pad configuration requires relay out of I/O and ESD circuitry in a narrower pitch than the existing in-line versions. It requires special placement of bond pads and possible manual connection to bond pads. As this configuration becomes more standard, tools may be developed for the automatic placement of the bond pads and automatic techniques for bond pad interconnection to I/O and ESD circuitry. A script was written for the bonding pad placement of one eighth of the chip for this package. However, since the available autoroute tools do not allow non-orthogonal connections, connections to the bond pads may be done manually until new tools are developed.

In a conventional single-row in-line bond pad arrangement, the minimum pad I/O ring size is a function of the minimum pad pitch, the I/O and ESD circuitry height including the required spacing between them, and the total pin count. The width of one side of a chip can be approximated by the following formula.

Side width=[(number of pads on the side)*(minimum I/O pitch)]+ [(2*(I/O height)]                 Eqn. 1

Therefore, for a 208 pin chip with 110 micron pad pitch when the I/O and ESD structure heights are about 500 microns, and the minimum chip size will be about 500 microns, the minimum chip size will be 6.72×6.72 mm sq. Not including the pad spacers, die ring or the scribe line.

In a staggered pad configuration, the I/O pitch is reduced to 84.25 microns. Due to the two rows of bonding pad openings and narrower I/O pitch, the total block height is increased to 660 microns. Therefore, the minimum chip size will be about 5.69×5.69 mm sq. This chip will be approximately 1 mm on each side smaller than an in-line version of 110 micron pad pitch even though the pad height has increased by 160 microns.

From Equation 1, since the only differences in the in-line bonding pad arrangement and the staggered pads are the increase in the I/O and ESD circuitry height, the I/O pitch and the extra 140 microns height in the bonding area, therefore, for a square die, the following conditional expression holds:

[(#of pads)/8]*[(in-line I/O pitch)−(staggered I/O pitch)]<[(I/O height staggered)−(I/O height in-line)+140]

If the above equation is valid, then it is a better area trade off to use the staggered pad configuration versus the in-line version of bonding pad placement. If the two sides of the equations are equal then there is no area benefit from using the staggered bonding pad configuration.

If there is area benefit to using a staggered bond configuration, the bonding pads are laid out. The method of laying out the bonding pad includes the steps of: determining the number of bonding pads to be distributed along a predetermined distance; and positioning the determined number of bonding pads in a first bonding pad row and a second bonding pad row, wherein the second row of bonding pads is positioned a predetermined distance away from the first row of bonding pads wherein the second row of bonding pads is radially staggered with respect to a the first row of bonding pads.

It is understood that the above description is intended to be illustrative and not restrictive. For example, placement of the ESD structures, I/O and bonding pads with respect to each other is not critical. For example, in relationship to each other, the ESD structure is positioned along on the outer periphery of the die, and the bonding pad is positioned between the ESD structure and the I/O circuitry. However, alternatively the positioning of any of the functional modules of the I/O pad may be changed. For example, the bonding pad may be placed along the outer periphery of the die, while the ESD structure is positioned between the bonding pad and the I/O circuitry. Further, instead of two rows of bonding pads being radially staggered, more than two rows may be radially staggered. For example, three rows may be radially staggered instead of two rows. In addition, the integrated circuit die may have more than one projection point. Further, the bonding pad configuration of the present invention is defined as a first row of bonding pads on an integrated circuit die and a second of bonding pads positioned a predetermined distance from the first row of bonding pads, wherein the second row of bonding pads is radially staggered from the first row of bonding pads. The predetermined distance between the first and second rows may be zero. Further, any subset of the bonding pads may be radially staggered. The scope of the invention should therefore not be determined with reference to the above description, but instead should be determined with reference to the appended claims along with the full scope of equivalents to which such claims are entitled.

What is claimed is:

1. A bonding pad configuration on an integrated circuit die having a projection point comprising:
   a first row of bonding pads on an integrated circuit die; and
   a second row of bonding pads positioned a predetermined distance from the first row of bonding pads, wherein the second row of bonding pads is radially staggered from the first row of bonding pads, wherein projection lines extend from the projection point to the center of each bonding pad, wherein the angular separation between adjacent projection lines is uniform, wherein the angular separation between adjacent projection lines is defined by the constant intercept method.

2. A bonding pad configuration on an integrated circuit die having a projection point comprising:
   a first row of bonding pads on an integrated circuit die; and
   a second row of bonding pads positioned a predetermined distance from the first row of bonding pads, wherein the second row of bonding pads is radially staggered from the first row of bonding pads, wherein projection lines extend from the projection point to the center of each bonding pad, wherein the angular separation between adjacent projection lines is uniform wherein the angular separation between adjacent projection lines is defined by the geometric progression placement algorithm.

3. An interconnection configuration for electrically coupling bonding pads on an integrated circuit having a projection point to a plurality of leads, comprising:
   a first row of bonding pads on an integrated circuit die;
   a second row of bonding pads on an integrated circuit die, the second row of bonding pads positioned a predetermined distance from the first row of bonding pads, wherein the second row of bonding pads is radially staggered from the first row of bonding pads, wherein projection lines extend from the projection point to the center of each bonding pad, wherein the angular separation between adjacent projection lines is uniform; and
   wherein the plurality of leads electrically is coupled to the first row of bonding pad and the second row of bonding pads, wherein the spacing between adjacent leads is uniform, wherein the angular separation between adjacent projection lines is defined by the constant intercept method.

4. An interconnection configuration for electrically coupling bonding pads on an integrated circuit having a projection point to a plurality of leads, comprising:
   a first row of bonding pads on an integrated circuit die;
   a second row of bonding pads on an integrated circuit die, the second row of bonding pads positioned a predetermined distance from the first row of bonding pads, wherein the second row of bonding pads is radially staggered from the first row of bonding pads, wherein projection lines extend from the projection point to the center of each bonding pad, wherein the angular separation between adjacent projection lines is uniform; and
   wherein the plurality of leads electrically is coupled to the first row of bonding pads and the second row of bonding pads, wherein the spacing between adjacent leads is uniform, wherein the angular separation between adjacent projection lines is defined by the geometric progression placement algorithm.

* * * * *